United States Patent [19]

Eichen et al.

[11] Patent Number: 4,749,277
[45] Date of Patent: Jun. 7, 1988

[54] METHODS OF AND APPARATUS FOR MEASURING THE FREQUENCY RESPONSE OF OPTICAL DETECTORS

[75] Inventors: Elliot G. Eichen, Arlington; Andrew Silletti, Norwood, both of Mass.

[73] Assignee: GTE Laboratories Incorporated, Waltham, Mass.

[21] Appl. No.: 4,504

[22] Filed: Jan. 20, 1987

[51] Int. Cl.⁴ .................................................. G01B 9/02
[52] U.S. Cl. ........................................................ 356/349
[58] Field of Search ................................. 356/345, 349; 324/158 D

[56] References Cited

U.S. PATENT DOCUMENTS 3,503,012  3/1970  Gillard ......................... 356/349 X Primary Examiner—Davis L. Willis
Assistant Examiner—Matthew W. Koren
Attorney, Agent, or Firm—Fred Fisher

[57] ABSTRACT

Methods of and apparatus for measuring the frequency response of optical detectors based on interferometrically demodulating a frequency modulated semiconductor laser. Detectors can be characterized where the 3 dB roll-off frequency is in excess of 100 GHz, is self-calibrating by simplified and inexpensive techniques.

12 Claims, 4 Drawing Sheets

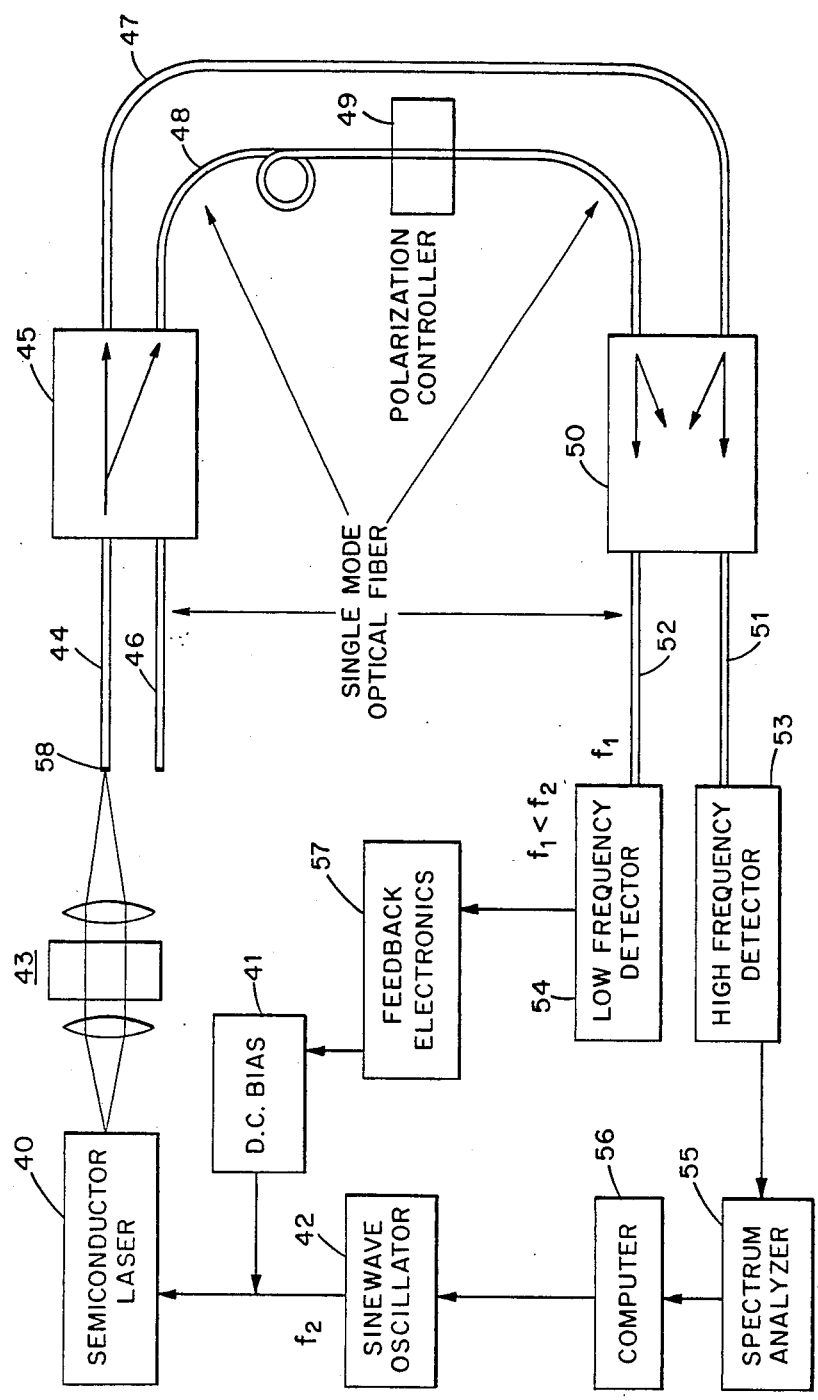

METHODS OF AND APPARATUS FOR MEASURING THE FREQUENCY RESPONSE OF OPTICAL DETECTORS

BACKGROUND OF THE INVENTION

1. Field of the Invention

This invention relates to methods of and apparatus for measuring the frequency response of optical detectors. Accordingly, it is a general object of this invention to provide new and improved methods and apparatus therefor.

2. General Background

The following listing of publications may be of interest to the reader. The relevance of the listed items will be apparent as they are referred hereinafter in the specification by their associated superscripts:

[1] H. Blauvelt et al., Fabrication and characterization of GaAs Schottky barrier photodetectors for microwave fiber optic links, Appl. Phys. Lett. 45 pp. 195–196 (1984)

[2] Torbjom Anderson et al., Temporal and frequency response of avalanche photodiodes from noise measurements, Appl. Optics 19 pp. 3496–3499 (1980)

[3] C. A. Burrus et al., Improved very-high-speed packaged InGaAs PIN punchthrough photodiode, Elect. Lett. 21 pp. 262–263 (1985)

[4] L. Piccari and P. Spano, New method for measuring ultrawide frequency response of optical detectors, Elect. Lett. 18 pp. 116–118 (1981)

[5] C. H. Henry, Theory of the linewidth of semiconductor lasers, IEEE JQE 18 pp. 259–264 (1982)

[6] S. Kobayashi et al., Direct frequency modulation in AlGaAs semiconductor lasers, IEEE JQE 18 pp. 582–195 (1982)

[7] E. Eichen et al., Intrinsic lineshape and FM response of modulated semiconductor lasers, Elect. Lett. 21 pp. 849–850 (1985)

[8] J. Schlafer et al., 20 GHz Bandwidth InGaAs Photodetector for Long-Wavelength Microwave Optical Links, Elect. Lett. 21 pp. 469–471 (1985)

As the bandwidth of optical detectors reaches beyond 100 GHz, it becomes increasingly difficult to measure their frequency response. Swept frequency measurements require either an intensity modulated laser or an external modulator, both with a known response greater than that of the detector[1]; due to the extremely low signal levels obtained during the measurement of the shot noise frequency spectrum, the utilization of amplifiers is required[2]; time domain measurements requiring picosecond optical pulses are easily affected by sampling and computational errors[3]; and the beat frequency method requires two narrow linewidth (usually external cavity) semiconductor lasers with excellent temperature control and no optical feedback[4]. Swept frequency and shot noise measurements are typically limited in bandwidth, and the other techniques can be experimentally difficult and/or expensive.

When the amplitude modulation portion of the electric field of a semiconductor laser is modulated, by modulating the current a side effect results in that the optical frequency of the electric field is also modulated[5-6].

In the absence of an interferometer, the modulation of current in a semiconductor laser, at a given frequency (such as 100 Hertz, for example), results in a light intensity that is also modulated at the same frequency (100 Hertz, in this example).

SUMMARY OF THE INVENTION

Another object of this invention is to provide for new and improved methods of and apparatus for measuring the frequency response of optical detectors in which an optical source (a semiconductor laser) can be modulated at a frequency substantially less than the bandwidth thereof.

Still another object of this invention is to provide for new and improved methods of and apparatus for measuring the frequency response of optical detectors wherein, by modulating a laser at a frequency f, light output is obtained having a plurality of frequencies nf, wherein n are integers greater than one.

Yet another object of this invention is to provide for new and improved methods of and apparatus for measuring the frequency response of optical detectors, whose 3 dB roll-off frequency is in excess of 100 GHz; is selfcalibrating in that a laser with a flat or known modulation frequency response is not required; is experimentally simple, inexpensive and fast; and can be made into a compact test instrument for automated device characterization on a production basis.

In accordance with one aspect of the invention, a method of measuring the frequency response of an optical detector includes driving a semiconductor laser with a sum of a direct current bias and an alternating current. The laser is so driven to produce a beam of light having an electric field whose amplitude and frequency is modulated. The light is applied to an interferometer, splitting the light into two paths, delaying one path with respect to the other path, and combining the resultant paths. Thus, the amplitude modulation of each path, due to the amplitude of the electric field from the laser cancels, and the sole amplitude modulation remaining is due solely to the frequency modulation portion of the electric field of the laser beam. In accordance with certain features of the invention, the alternating current has a frequency f, and the sole amplitude modulation has a plurality of frequencies nf, wherein n are integers greater than one. The interferometer can be adjusted to cancel amplitude modulated portions of the electric field but not the frequency modulated portions thereof.

In accordance with another aspect of the invention, apparatus for measuring the frequency response of an optical detector includes a semiconductor laser and means for providing a direct current bias thereto. Alternating current means are provided to the semiconductor laser so that the semiconductor laser can be so driven to produce a beam of light having an electric field whose amplitude and frequency is modulated. Interferometric means are coupled to receive the beam for splitting the light into two paths, for delaying one path with respect to the other path, and for combining the resultant paths. Thus, the amplitude modulation of each path, due to the amplitude of the electric field from the laser cancels, and the sole amplitude modulation remaining is due solely to the frequency modulation portion of the electric field of the laser beam. Means are provided for analyzing the sole remaining amplitude modulation. In accordance with certain features of the invention, the interferometric means can include a Michelson interferometer having a pair of optical corner cubes and means for translating one of the cubes with respect to the other cube. The interferometric means could include a Mach Zender interferometer that can provide a set of high frequencies for analysis, and a low frequency for controlling the direct current bias. The low frequency has a frequency $f_1$, and the alternating current means has a frequency $f_2$ wherein $f_1$ is less than $f_2$.

BRIEF DESCRIPTION OF THE DRAWINGS

Other objects, advantages, and features of this invention, together with its construction and mode of operation, will become more apparent from the following description, when read in conjunction with the accompanying drawings, in which:

FIG. 4 is a diagram of another embodiment of this invention utilizing a Mach Zender interferometer.

DESCRIPTION OF PREFERRED EMBODIMENTS

The frequency modulation sideband technique, described hereinafter, is capable of measuring the frequency response of optical detectors. Due to strong coupling between the real and imaginary indices of refraction, small changes in the bias current of a semiconductor laser are accompanied by relatively large changes in the optical frequency[5,6]. It is thus possible to generate high order frequency modulated sidebands that contain considerable power from small current modulation of a semiconductor laser. The FM frequency components generated by such modulation can be converted to AM using an interferometer. This combination of laser and interferometer acts as a source of extremely high elevated frequency amplitude modulation with a prescribed amount of power in each harmonic of the modulation frequency. The response of a detector placed at the output of an interferometer is obtained by measuring the power in each of these harmonics, and comparing it with a known result as depicted in FIG. 1.

Figure 1:
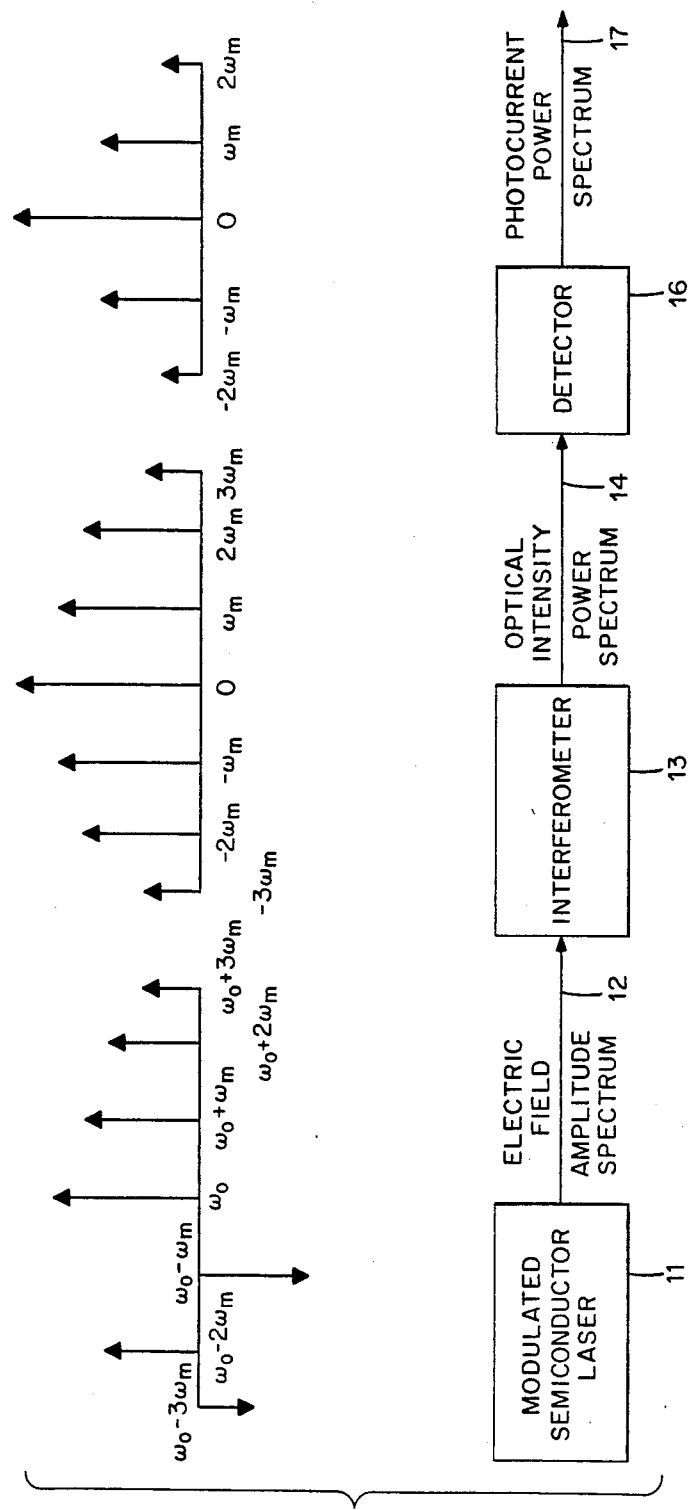
FIG. 1 is a diagram showing the output of a modulated semiconductor laser coupled to an interferometer which is further coupled to a detector; the electric field of the optical spectrum from the laser, the intensity spectrum from the interferometer, and a photocurrent spectrum from the detector are depicted by their associated waveforms.

FIG. 1 depicts a modulated semiconductor laser 11 which produces an optical spectrum generating an electric field on a line 12, which is coupled to an interferometer 13. The interferometer 13 generates an intensity spectrum along a line 14, which is coupled to an optical detector 16. The optical detector 16 generates a photocurrent spectrum along a line 17.

A representation of the electric field of the optical spectrum along the line 12 is depicted in the chart immediately thereabove, illustrating the field as having both positive and negative frequency components. The field chart directly above the intensity spectrum along the line 14, to designate the output of the interferometer 13, shows a variance in intensity at different multiples of optical frequency. Similarly, the waveform depicted above the photocurrent spectrum along the line 17 indicates the output of the detector 16.

The foregoing apparatus and measurement technique depicted in FIG. 1 has been used to characterize InGaAs PIN detectors having 3 dB roll-off frequencies between 3 and 20 GHz[8]. Such instrumentation should be of interest in the manufacturing of fiber optic test instruments and to the manufacture of optical semiconductors.

Figure 2:
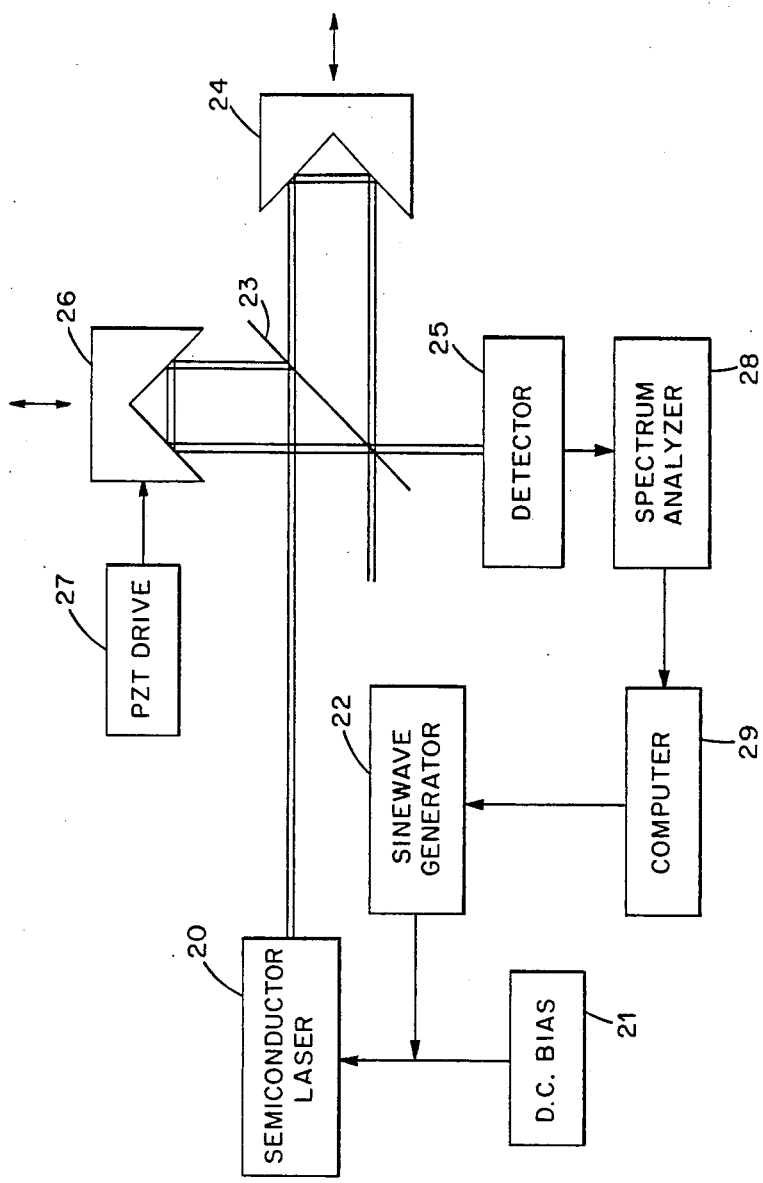
FIG. 2 is a block diagram of one embodiment of the invention utilizing a Michelson interferometer.
Figure 3:
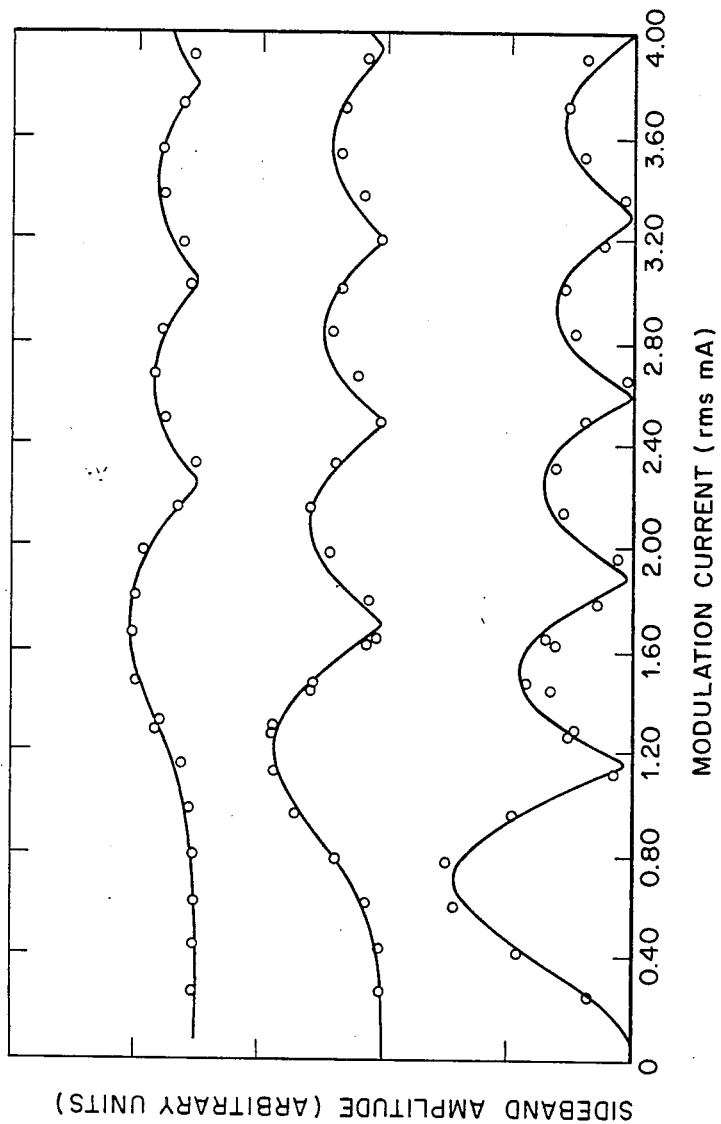
FIG. 3 is a chart of sideband amplitude versus modulation current for 3 even sidebands of light output from the interferometer.

Referring to FIG. 2, there is illustrated a block diagram of one embodiment of the invention utilizing a Michelson interferometer. As depicted therein, the semiconductor laser 20 is driven by both a DC bias 21 and sinewave generator 22. Coherent light from the semiconductor laser 20 is directed to a beamsplitter 23. The beamsplitter 23 permits part of the light to travel therethrough while it simultaneously reflects the remainder of the light. The light that passes through the beamsplitter 23 is directed to a reflecting side of a corner cube 24. Light hitting the reflective side of the corner cube 24 is reflected to a second side of the corner cube 24 which is perpendicular to the first side, whereupon light is reflected back along a path parallel to the initial path of the light but displaced therefrom (i.e., not co-linear therewith). The light reflected back to the beamsplitter 23 is, in part, passed through (which can be ignored), while the remaining portions are reflected along a perpendicular path towards a detector 25.

The portion the light from the semiconductor 20 which is reflected by the beamsplitter 23 is directed to one side of another corner cube 26, and reflected thereby to another reflecting side thereof. Thus, light impinged upon the corner cube 26 is reflected to a direction opposite to that initially applied thereto, parallel but not co-aligned therewith. The latter reflected light is directed to the beamsplitter 23 to which some light is reflected therefrom (which can be ignored) while remaining light passes through the beamsplitter 23 along a path co-aligned with the reflected light from the corner cube 24 onto the detector 25.

A corner cube, as used herein, is a reflecting device which returns a laser beam in the direction of its source parallel thereto but not co-aligned with, consisting of three mutually perpendicular reflecting surfaces.

The corner cubes 24, 26 can be moved, with respect to each other, along the directions indicated by the arrows. Typically, one would be fixed, such as the corner cube 24, in position, while the other corner cube 26 can be moved up and down by a suitable drive source such as a piezoelectric translating drive 27 (shown in the drawing as a PZT drive). The output of the detector 25 can be analyzed by a spectrum analyzer 28, which output represents the details displayed by the detector 25.

If desired, though not mandatory, the output of the spectrum analyzer can be coupled to a computer 29 which is coupled to control the sinewave generator 22. The spectrum of the photocurrent from the detector 25 placed at the output port of the Michelson interferometer 23, 24, 26 is $D(\omega)S(\omega)$, where $D(\omega)$ is the frequency response of the optical detector 25 and where $S(\omega)$ is the intensity spectrum (at the output of the interferometer) of the signal I, given by $$I\alpha\{1m \cos \omega_m t + m \cos [\omega_m(t+\tau)] + V(\tau)r(\tau)\} \quad (1)$$

In the foregoing $V(\tau)$ is the fringe visibility function due to stochastic phase fluctuations[7] and the deterministic contribution to the electric field autocorrelation function, $r(\tau)$ can be written as $$r(\tau) = E(t)E^*(t - \tau) + c.c. \qquad (2)$$

$$= \overline{\sqrt{[1 + m\cos\omega_m t][1 + m\cos(\omega_m(t + \tau))]}}$$

$$\exp\{i\omega_0\tau\} \sum_{k=-\infty}^{+\infty} i^k J_k(Z) \exp\{ik\omega_m t + \phi_m\} + c.c.$$

$$\simeq \left\{ 1 + m\cos\phi_m \cos(\omega_m t + \phi_m) - \frac{m^2}{2}\sin^2\phi_m \sin^2(\omega_m t + \phi_m) \right\}$$

$$\left\{ J_0(Z)\cos\omega_0\tau + 2\cos\omega_m\tau \sum_{k=2,4,\ldots}^{\infty} J_k(Z)\cos\left(k\omega_m t + k\phi_m + k\frac{\pi}{2} + \theta\right) + \right.$$

$$\left. 2\sin\omega_0\tau \sum_{k=1,3,\ldots}^{-\infty} J_k(Z)\cos(k\omega_m t + k\phi_m + k\pi + \theta) \right\}$$

If the path length difference in the interferometer is chosen such that $\omega_m\tau=\pi$, then the field components of the amplitude modulation proportional to m in the two arms of the interferometer are $\pi$ out of phase, and cancel. When this condition for the optimum value for $\tau$ is satisfied, and if $m^2 \ll 1$, then the power in the even and odd harmonics will be $4\cos^2\omega_0\tau J_k^2(2\beta)$ and $4\sin^2\omega_0\tau J_k^2(2\beta)$ respectively. The power in these harmonics is independent of the laser's modulation index m. The absolute value of the first three even sidebands as a function of modulation current (which is linearly proportional to $\beta$) for an interferometer adjusted to a bright fringe ($\cos\omega_0\tau=1$) is shown in FIG. 2. The optimum value of $\nu$ also maximizes the argument of the Bessel functions, $2\beta\sin\phi_m$.

If the modulation current is large enough such that terms proportional to $m^2$ and higher powers cannot be neglected, than all the harmonics will contain additional terms that are due to a mixture of AM and FM that result from the beat between the $m^2/2\sin^2(\omega_m t + \Phi_m)$ AM term and the FM harmonics. In this case, the power in each harmonic will depend upon both m and the phase lag between the FM and AM components of the electric field, and the detector response will be more difficult to unfold from the measured photocurrent power spectrum.

A preferred way to measure the response of a detector is to vary the amplitude of the modulation current to maximize the power in a given sideband. Since the maximum value of the kth Bessel function, $J_k(2\beta_{max})$, occurs for only one value of its argument, the power in the photocurrent at frequency $k\nu_m$ with this modulation current, $D(k\nu_m)J^2(2\beta_{max})$, is unique. Choosing a low enough modulation frequency such that the detector response at $2\nu_m$ has not yet begun to roll off ($D(k\nu_m)=1$), the detector response at frequency $k\nu_m$ is found by comparing the ratio of maximum power in the photocurrent at this frequency to the maximum power at frequency $2\nu_m$. If the measured photocurrent at frequency $\nu$ is $S(\nu)$, then the detector response at $k\nu_m$ is given by $$D(k\nu_m) = \frac{S(k\nu_m)J_2^2(2\beta_{max})}{S(2\nu_m)J_k^2(2\beta_{max})}$$

The advantages of this procedure are that AM and FM responses of the laser do not have to be known, and that there are no free parameters.

The measurement described herein using a Michelson interferometer with corner cubes 24, 26 instead of mirrors (as shown in FIG. 2) prevents feedback to the laser 20. A low frequency detector 25 and a piezoelectric translater 27 attached to one of the corner cubes, such as cube 26, can be used in a feedback loop to stabilize the interferometer 24, 23, 26. Alternatively, the piezoelectric translator 27 can be scanned and the spectrum analyzer 28 set to the acquired peak-held signal. The mismatch in the path length, $\tau$, the time delay between arms in the interferometer, is chosen to maximize the argument of the Bessel function, $2\beta\sin(\omega_m\tau/2)$, within the constraint of reasonable fringe contrast. While it is not absolutely necessary that the source be a distributed feedback laser, it is necessary that the linewidth or the side mode suppression ratio of the laser 20 not change when the modulation current is varied. When these parameters are changed, the resulting change in the coherence function might be interpreted as a change in the detector 20 response. This condition is most easily achieved using a distributed feedback laser. An extremely stable (frequency synthesized) sinewave generator 22 reduces problems due to frequency jitter, which jitter is more evident at higher sideband indices (i.e., for $\omega_m=250$ MHz, the frequency jitter observed at 20 GHz - $J_{80}(Z)$ is 80× the jitter of the oscillator). The computer 29 changes the modulation current and the spectrum analyzer 28 center frequency for the appropriate indexed sideband.

Referring to FIG. 4, there is shown another embodiment of the invention utilizing a Mach Zender interferometer.

A semiconductor laser 40 is driven by both a DC bias source 41 and a sinewave oscillator 42 which produces a sinewave at a frequency $f_2$. The output of the semiconductor laser 40 is driven through an optical isolator 43 to one input fiber 44 of a fiber coupler 45. The optical isolator 43 is inserted into the path between the semiconductor laser 40 and the input fiber 44 of the fiber coupler 45 to prevent optical feedback to the semiconductor laser 40. The optical isolator 43 can be, for example, a Faraday rotator. A second input fiber 46 is typically coupled to the fiber coupler 45; no signals are applied to the other fiber 46. Light along the input fiber 44 of the fiber coupler 45 is split so that part of the light travels along one path 47 while the remainder of the light passes through the path 48. One 48 of the paths 47, 48 is passed through a polarization controller 49 to a second fiber coupler 50. The other line 47 can be directly coupled to the fiber coupler 50. Light along the line 48 is split by the fiber coupler 50 into two paths, one along the path 51, the other along the path 52. Likewise, light from the path 27 is split by the fiber coupler 50 onto the paths 51, 52. The line 51 is coupled to a high frequency detector 53 which detects frequencies above a certain level such as, for example, those equal to or greater than 500 Hertz. In similar fashion, a low frequency detector 54 coupled to receive signals along the line 52 can detect signals below a certain frequency such as 500 Hertz. The frequencies detected along the line 51 can be represented as $f_1$, wherein $f_1$ is less than $f_2$.

The output of the high frequency detector 53 is coupled to a spectrum analyzer 55 which controls a computer 56. The computer 56 can be used for controlling the sinewave oscillator 42. The output of the low frequency detector 54 is coupled through the feedback electronics 57 to control the DC bias 41. The two fiber couplers 47, 48 are used to create a fiber based Mach Zender interferometer. The Faraday rotator 43 prevents feedback into the laser diode 40. The polarization controller 49 matches the polarization from the two unequal length fibers 47, 48. Feedback is further reduced by an indexed matched lens 58 at the end of the fiber 44. The interferometer can be stabilized by feeding back a signal proportional to the DC intensity from one of the output ports (52, for example) to the laser bias 41, and using the bias dependence on optical frequency to tune to a bright or gray fringe, thus making the system extremely compact and stable.

Various modifications can be performed without departing from the spirit and scope of this invention.

What is claimed is:

1. A method comprising the steps of
   driving a semiconductor laser with the sum of a direct current bias and an alternating current, said laser being so driven to produce a beam of light having an electric field whose amplitude and frequency is modulated,
   applying said light to an interferometer, splitting said light into two paths, delaying one path with respect to the other path, and combining the resultant paths,
   whereby the amplitude modulation of each path, due to the amplitude of the electric field from said laser cancels, and the sole amplitude modulation remaining is due solely to the frequency modulation portion of said electric field of said laser beam.

2. The method as recited in claim 1 wherein
   said alternating current has a frequency f, and
   said sole amplitude modulation has a plurality of frequencies nf,
   wherein n are integers greater than one.

3. The method as recited in claim 1 wherein said interferometer is adjusted to cancel amplitude modulated portions of said electrical field but not the frequency modulated portion thereof.

4. Apparatus comprising
   a semiconductor laser;
   means for providing a direct current bias to said semiconductor laser;
   means for providing an alternating current to said semiconductor laser,
   whereby said semiconductor laser can be so driven to produce a beam of light having an electric field whose amplitude and frequency is modulated;
   interferometric means coupled to receive said beam, for splitting said light into two paths, for delaying one path with respect to the other path, and for combining the resultant paths,
   whereby the amplitude modulation of each path, due to the amplitude of the electric field from said laser cancels, and the sole amplitude modulation remaining is due solely to the frequency modulation portion of said electric field of said laser herein, and
   means for analyzing said sole remaining amplitude modulation.

5. The apparatus as recited in claim 4 wherein said interferometric means includes a Michelson interferometer having
   a pair of optical corner cubes, and
   means for translating one of said cubes with respect to the other of said cubes.

6. The apparatus as recited in claim 4 wherein said interferometric means includes a Mach Zender interferometer that can provide a set of high frequencies for analysis, and a low frequency for controlling said direct current bias,
   said low frequency having a frequency $f_1$,
   said alternating current having a frequency $f_2$ and wherein $f_1 > f_2$.

7. A method of measuring the frequency response of an optical detector comprising the steps of
   driving a semiconductor laser with the sum of a direct current bias and an alternating current, said laser being so driven to produce a beam of light having an electric field whose amplitude and frequency is modulated,
   applying said ligh to an interferometer, splitting said light into two paths, delaying one path with respect to the other path, and combining the resultant paths,
   so that said electric field is applied to said optical detector,
   whereby the photocurrent from said detector is applied to an electrical spectrum analyzer, and the power in each harmonic of the modulation frequency is compared to a known quantity, and
   whereby the amplitude modulation of each path, due to the amplitude of the electric field from said laser cancels, and the sole amplitude modulation remaining is due solely to the frequency modulation portion of said electric field of said laser beam.

8. The method as recited in claim 7 wherein
   said alternating current has a frequency f, and
   said sole amplitude modulation has a plurality of frequencies nf,
   wherein n are integers greater than one.

9. The method as recited in claim 7 wherein said interferometer is adjusted to cancel amplitude modulated portions of said electrical field but not the frequency modulated portion thereof.

10. Apparatus for measuring the frequency response of an optical detector comprising
    said detector;
    a semiconductor laser;
    means for providing a direct current bias to said semiconductor laser;
    means for providing an alternating current to said semiconductor laser,
    whereby said semiconductor laser can be so driven to produce a beam of light having an electric field whose amplitude and frequency is modulated;
    interferometric means coupled to receive said beam, for splitting said light into two paths, for delaying one path with respect to the other path, and for combining the resultant paths,
    whereby the amplitude modulation of each path, due to the amplitude of the electric field from said laser cancels, and the sole amplitude modulation remaining is due solely to the frequency modultion portion of said electric field of said laser herein, and means for analyzing said sole remaining amplitde modulation, so that said electric field is applied to said optical detector, whereby the photocurrent from said detector is applied to said analyzing means, and the power in each harmonic of the modulation frequency is compared to a known quantity.

11. The apparatus as recited in claim 10 wherein said interferometric means includes a Michelson interferometer having a pair of optical corner cubes, and means for translating one of said cubes with respect to the other of said cubes.

12. The apparatus as recited in claim 10 wherein said interferometric means includes a Mach Zender interferometer that can provide a set of hifh frequencies for analysis, and a low frequency for controlling said direct current bias, said low frequency having a frequency $f_1$, said alternating current having a frequency $f_2$ and wherein $f_1 < f_2$.

* * * * *